(12) United States Patent
Kawano

(10) Patent No.: US 12,142,715 B2
(45) Date of Patent: Nov. 12, 2024

(54) LIGHT-EMITTING DEVICE

(71) Applicant: NICHIA CORPORATION, Anan (JP)

(72) Inventor: Yusuke Kawano, Anan (JP)

(73) Assignee: NICHIA CORPORATION, Anan (JP)

( * ) Notice: Subject to any disclaimer, the term of this patent is extended or adjusted under 35 U.S.C. 154(b) by 185 days.

(21) Appl. No.: 17/006,866

(22) Filed: Aug. 30, 2020

(65) Prior Publication Data

US 2021/0066565 A1   Mar. 4, 2021

(30) Foreign Application Priority Data

Aug. 30, 2019   (JP) .................................. 2019-159045

(51) Int. Cl.
| | |
|---|---|
| *H01L 33/62* | (2010.01) |
| *H01L 27/15* | (2006.01) |
| *H01L 33/10* | (2010.01) |
| *H01L 33/48* | (2010.01) |

(52) U.S. Cl.
CPC ............ *H01L 33/62* (2013.01); *H01L 27/156* (2013.01); *H01L 33/10* (2013.01); *H01L 33/486* (2013.01)

(58) Field of Classification Search
CPC ....... H01L 33/10; H01L 33/486; H01L 33/62; H01L 27/156
See application file for complete search history.

(56) References Cited

U.S. PATENT DOCUMENTS

| | | | |
|---|---|---|---|
| 2013/0038246 A1 | 2/2013 | Sasano | |
| 2013/0141891 A1* | 6/2013 | Funakubo | ............... F21V 23/06 362/249.06 |
| 2014/0034973 A1 | 2/2014 | Oka et al. | |
| 2015/0016109 A1* | 1/2015 | Ogata | ................... H01L 41/047 362/249.02 |
| 2015/0176820 A1* | 6/2015 | Abe | .................... H01L 25/0753 362/249.14 |
| 2016/0093784 A1 | 3/2016 | Kawano | |
| 2017/0317250 A1* | 11/2017 | Konishi | ................. H01L 33/62 |

(Continued)

FOREIGN PATENT DOCUMENTS

| | | | |
|---|---|---|---|
| JP | 2010287657 A | * | 12/2010 |
| JP | 2014-029949 | | 2/2014 |
| JP | 2015-035601 | | 2/2015 |

(Continued)

*Primary Examiner* — Shaun M Campbell

(74) *Attorney, Agent, or Firm* — MORI & WARD, LLP

(57) ABSTRACT

A light-emitting device includes light-emitting elements connected through a wiring pattern, at least one wire electrically connecting a portion of the wiring pattern to another portion of the wiring pattern, and a reflective member covering a region of the mounting board except for the wiring pattern. The wiring pattern includes wire connection regions at such a distance from each other as to allow the wire to connect the connection regions to each other. The connection regions being used to connect the light-emitting elements in series and/or in parallel by the wire in any one pattern of a plurality of connection patterns with different numbers of series and parallel connections. A plurality of rows of light-emitting elements each constituted of part of the light-emitting elements are disposed on the wiring pattern. The wiring pattern includes an extending portion provided outside of the rows and not provided between the rows.

28 Claims, 12 Drawing Sheets

(56) References Cited

U.S. PATENT DOCUMENTS

2018/0216803 A1 8/2018 Abe et al.
2018/0337315 A1* 11/2018 Yu .......................... H01L 24/06

FOREIGN PATENT DOCUMENTS

| | | | |
|---|---|---|---|
| JP | 2015-122377 | 7/2015 | |
| JP | 2016-072269 | 5/2016 | |
| JP | 2018-121038 | 8/2018 | |
| WO | WO2011/129202 | 10/2011 | |
| WO | WO-2016042800 A1 * | 3/2016 | ............. H01L 33/56 |

* cited by examiner

LIGHT-EMITTING DEVICE

CROSS-REFERENCE TO RELATED APPLICATION

This application is based upon and claims priority to Japanese Patent Application No. 2019-159045 filed on Aug. 30, 2019, the disclosure of which is hereby incorporated by reference in its entirety.

BACKGROUND OF THE INVENTION

1. Field of the Invention

The present disclosure relates to a light-emitting device.

2. Description of Related Art

For example, in a light-emitting device described in JP2015-122377A, a plurality of LEDs are connected in series and/or in parallel on a predetermined wiring pattern. Series connections and parallel connects of the LEDs are mixed particularly for the reason of specifications such as the amount of light and operating voltage required. Hence, individual design of the wiring pattern is required.

Certain embodiments of the present disclosure advantageously provide a light-emitting device in which switching between series connections and parallel connections using a common wiring pattern can be performed.

SUMMARY OF THE INVENTION

A light-emitting device according to one embodiment of the present invention includes a mounting board having an upper surface provided with a wiring pattern thereon, a plurality of light-emitting elements mounted on the wiring pattern and connected in series and/or in parallel through the wiring pattern, at least one wire electrically connecting a part of the wiring pattern to another part of the wiring pattern; and a first reflective member partially covering the upper surface of the mounting board except for the wiring pattern. The wiring pattern includes a plurality of wire connection regions, each of the wire connection regions being spaced apart at a distance such that the connection regions are connected by the wire to establish one of a plurality of connection patterns, each of which has different numbers of series connection and parallel connection of the light-emitting elements by the wire. A plurality of rows of the light-emitting elements are disposed on the wiring pattern, each row of the rows of the light-emitting elements being formed of a part of the light-emitting elements. The wiring pattern includes an extending portion that is provided outside of the rows of the light-emitting elements and not provided between the rows of the light-emitting elements.

A light-emitting device according to another embodiment of the present invention includes a mounting board having an upper surface provided with a wiring pattern thereon, at least one wire connecting line of the wiring pattern, a plurality of light-emitting elements mounted on the wiring pattern, and a first reflective member partially covering the upper surface of the mounting board except for the wiring pattern. A plurality of rows of the light-emitting elements are aligned, each row of the rows of the light-emitting elements being formed of a part of the light-emitting elements connected in series. The wire connects the rows of the light-emitting elements to each other in series on the wiring pattern. The wiring pattern includes an extending portion that is provided outside of the rows of the light-emitting elements. The extending portion connects the rows of the light-emitting elements to each other in series.

A light-emitting device according to still another embodiment of the present invention includes a mounting board having an upper surface provided with a wiring pattern thereon, the wiring pattern having lines, at least one wire connecting the lines of the wiring pattern, a plurality of light-emitting elements mounted on the wiring pattern, and a first reflective member partially covering the upper surface of the mounting board except for the wiring pattern. A plurality of rows of the light-emitting elements are aligned, each row of the rows of the light-emitting elements being formed of a part of the light-emitting elements connected in series. The wire connects the rows of the light-emitting elements to each other in parallel on the wiring pattern. The wiring pattern includes an extending portion that is provided outside the rows of the light-emitting elements. The extending portion has a thickness equal to or greater than a thickness of the first reflective member.

A mounting board for a light-emitting device according to even another embodiment has a wiring pattern on the upper surface such that a plurality of light-emitting elements are capable of being mounted on the wiring pattern, at least one wire electrically connecting a part of the wiring pattern to another part of the wiring pattern, and a first reflective member partially covering the upper surface of the mounting board except for the wiring pattern. The wiring pattern includes a plurality of wire connection regions, each of the wire connection regions being spaced apart at a distance such that the connection regions are connected by the wire to establish one of a plurality of connection patterns, each of which has different numbers of series connection and parallel connection of the light-emitting elements by the wire. A plurality of rows of the light-emitting elements are capable of being disposed on the wiring pattern, each row of the rows of the light-emitting elements formed of a part of the light-emitting elements. The wiring pattern includes an extending portion that is provided outside of the rows of the light-emitting elements and not provided between the rows of the light-emitting elements. The extending portion connects adjacent ones of the rows of the light-emitting elements in series.

With a light-emitting device according to certain embodiments of the present invention, switching between series connections and parallel connections using a mounting board provided with a common wiring pattern can be performed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
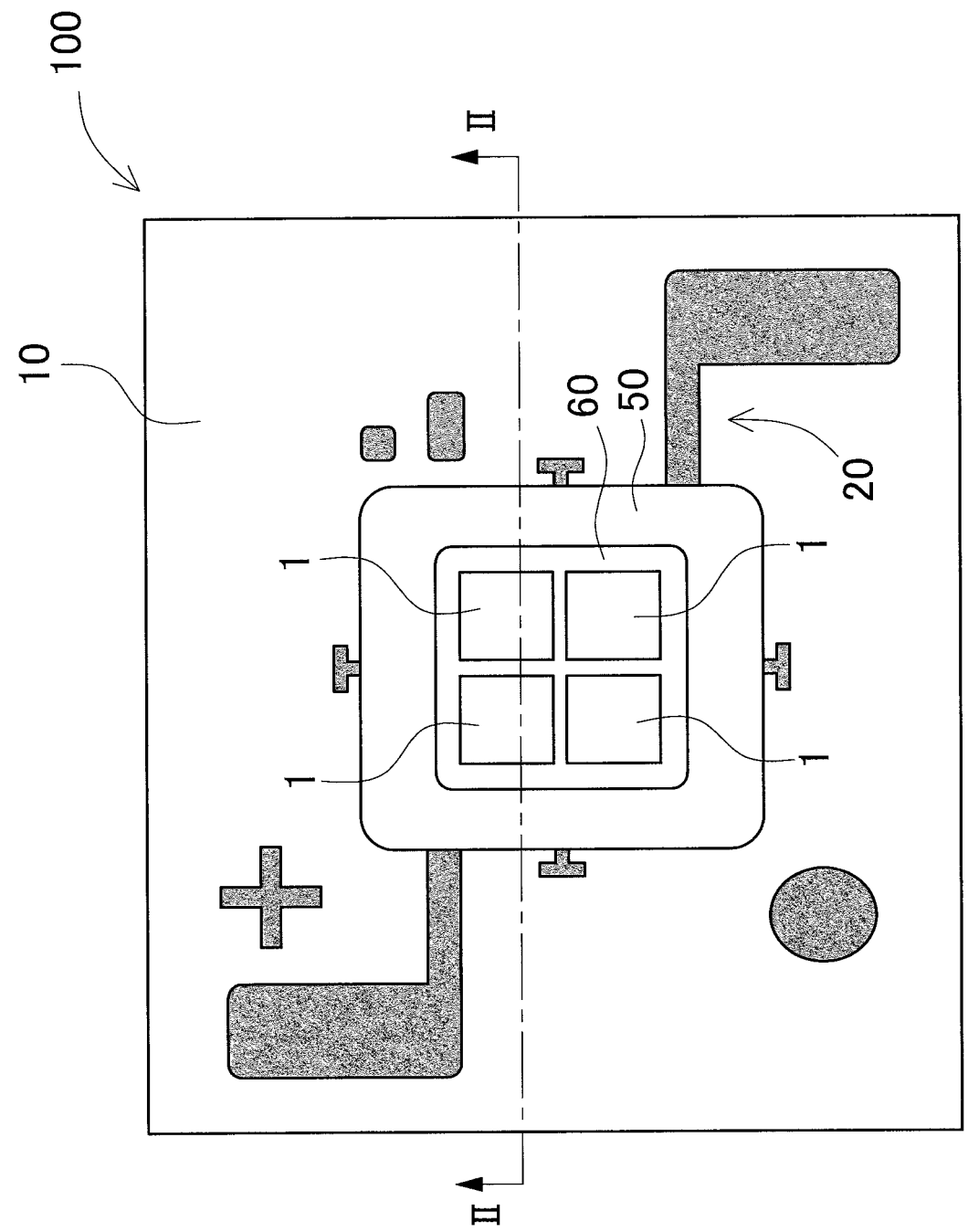
FIG. 1 is a schematic plan view of a light-emitting device according to a first embodiment.

A light-emitting device according to one embodiment includes a mounting board provided with a predetermined wiring pattern on an upper surface, at least one wire connecting lines of the wiring pattern, a plurality of light-emitting elements mounted on the wiring pattern, and a first reflective member covering a region of the mounting board except for the wiring pattern. A plurality of rows of light-emitting elements each including part of the plurality of light-emitting elements connected in series are aligned. The wire connects the rows of light-emitting elements to each other in series on the wiring pattern. The wiring pattern includes an extending portion outside the rows of light-emitting elements. The extending portion connects the rows of light-emitting elements to each other in series. With the structure described above, the rows of light-emitting elements can be disposed close to each other without a wiring pattern running between the rows of light-emitting elements, so that a lighting pattern close to the lighting pattern of a point source can be obtained. Further, with the light-emitting elements connected in series and/or in parallel through the wiring pattern, the amount of the wire to be used can be reduced, so that absorption of light by the wire can be reduced.

A light-emitting device according to another embodiment includes a mounting board provided with a predetermined wiring pattern on an upper surface, at least one wire connecting lines of the wiring pattern, a plurality of light-emitting elements mounted on the wiring pattern, and a first reflective member covering a region of the mounting board except for the wiring pattern. A plurality of rows of light-emitting elements each including part of the plurality of light-emitting elements connected in series are aligned. The wire connects the rows of light-emitting elements to each other in parallel on the wiring pattern. The wiring pattern includes an extending portion outside the rows of light-emitting elements. The extending portion has a thickness equal to or greater than a thickness of the first reflective member. With the structure described above, the wiring pattern can include the extending portion that is not used for electrical connections, and the extending portion can be effectively used to intercept a light-reflective resin.

Further, in a light-emitting device according to still another embodiment, in addition to any of the above structures, the rows of light-emitting elements can be constituted by connecting the plurality of light-emitting elements in series.

Further, in a light-emitting device according to still another embodiment, in addition to any of the above structures, the wiring pattern can predefine mounting positions each of which a respective one of the plurality of light-emitting elements is disposed at.

Further, in a light-emitting device according to still another embodiment, in addition to any of the above structures, the wiring pattern can restrict the posture of each of the light-emitting elements to a certain direction at the mounting positions.

Further, a light-emitting device according to still another embodiment can include, in addition to any of the above structures, a second reflective member covering the upper surface of the mounting board to surround the plurality of light-emitting elements, and the second reflective member can cover the wiring pattern including the wire. With the structure described above in which the wire that is used to switch between the connections is embedded in the second reflective member, mechanical stability such as impact resistance of the wire can be improved.

Further, in a light-emitting device according to still another embodiment, in addition to any of the above structures, the wire can be wire-bonded astride a portion of the wiring pattern.

Further, in a light-emitting device according to still another embodiment, in addition to any of the above structures, the plurality of light-emitting elements can be arranged in a matrix.

Further, in a light-emitting device according to still another embodiment, in addition to any of the above structures, the at least one wire can include a plurality of wires connecting a portion of the wiring pattern. With the structure described above, the load on each wire can be reduced and also reliability against disconnection or the like be improved.

Further, a light-emitting device according to still another embodiment can include, in addition to any of the above structures, a protective element disposed on a portion of the wiring pattern.

Further, in a light-emitting device according to still another embodiment, in addition to any of the above structures, the connection patterns can include series and parallel connection patterns with different numbers of series connections and parallel connections.

Certain embodiments of the present invention will be described below on the basis of the accompanying drawings. The embodiments below are examples intended to give a concrete form to the technical concept of the present invention and are not intended to limit the present invention to the description in the embodiments below. It should be noted that sizes or positional relationships of members illustrated in each drawing may be exaggerated in order to clarify the descriptions.

Furthermore, in the descriptions below, the same name or the same reference numeral represents the same member or a member made of the same material, and its duplicative description will be omitted as appropriate. A portion with the same reference numeral in a plurality of drawings represents the same or equivalent portion or member. As for each element that constitutes the embodiments of the present invention, a plurality of elements can be formed of one member so that the member serves as the plurality of elements, or conversely, a combination of a plurality of members can fulfill the function of one member. Constitutions described in one embodiment can be applicable another embodiment. The descriptions below include terms indicating specific directions or positions (such as "up", "down", "right", "left", and other terms containing these terms) as appropriate. These terms are used to facilitate understanding of the present invention referring to the drawings, and the meanings of these terms do not limit the technical scope of the present invention. The term "include" in the present specification is used to indicate both of inclusion as a separate member and inclusion as an integrated member.

First Embodiment

Figure 2:
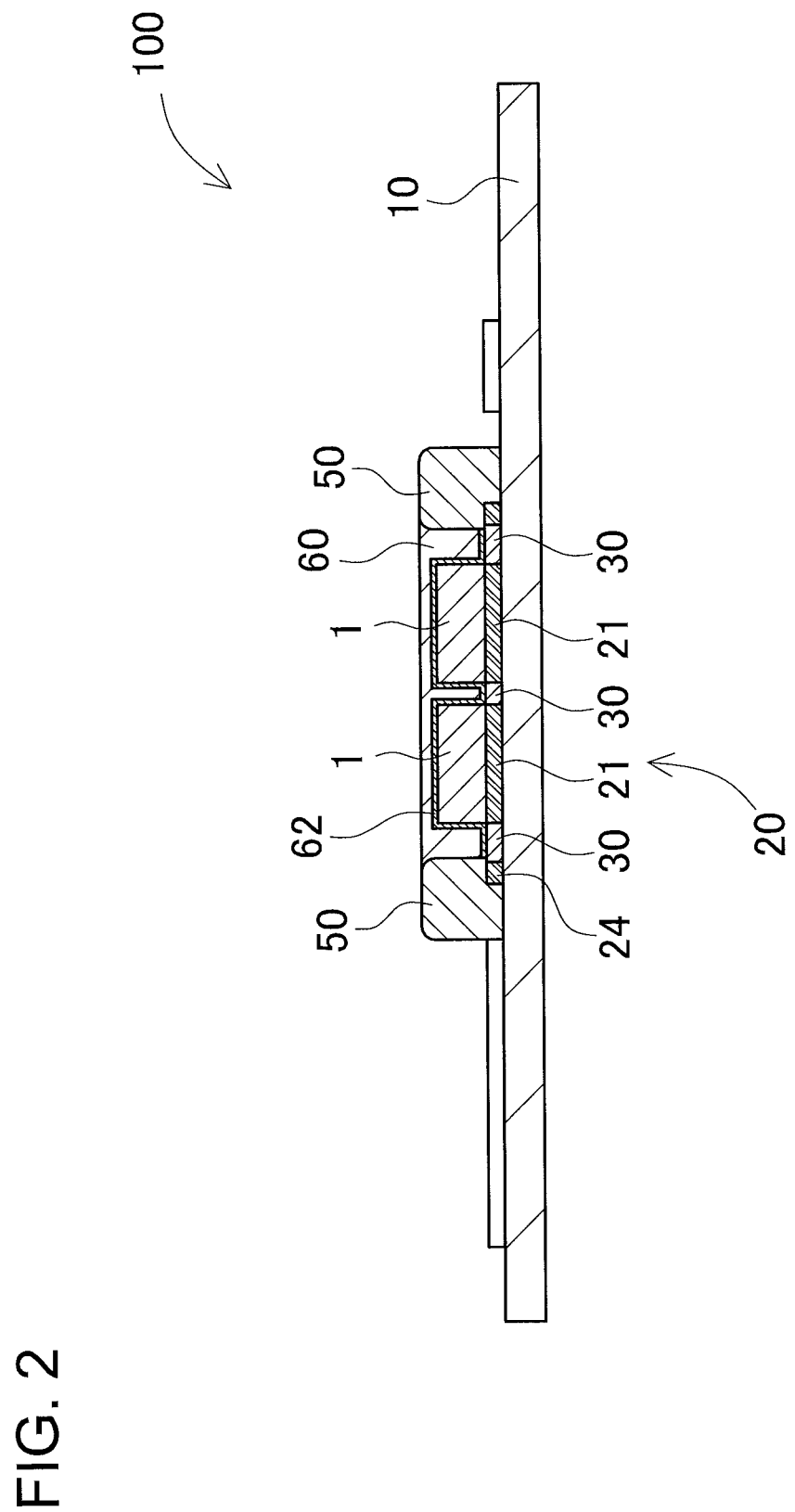
FIG. 2 is a schematic cross-sectional view taken along the line II-II of FIG. 1.
Figure 3:
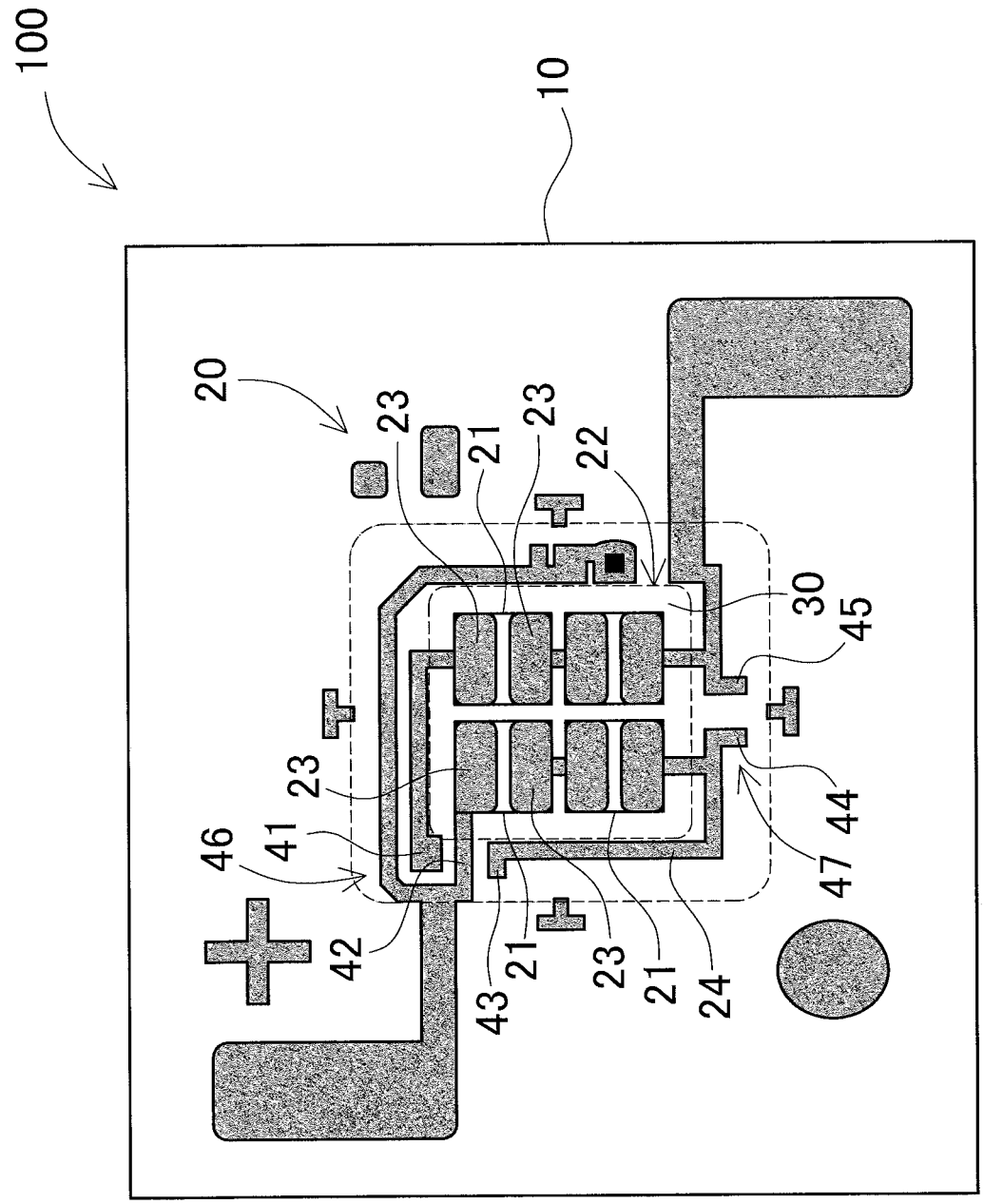
FIG. 3 is a schematic plan view showing an internal structure of a mounting board in FIG. 1.
Figure 4:
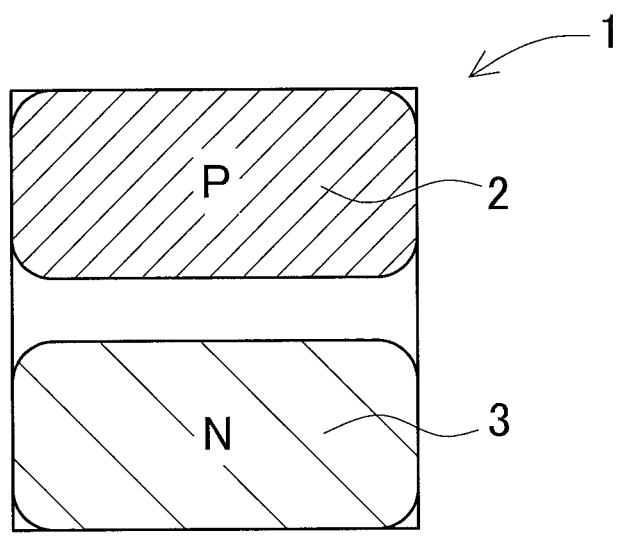
FIG. 4 is a schematic bottom view of electrodes of an LED in FIG. 1.
Figure 5:
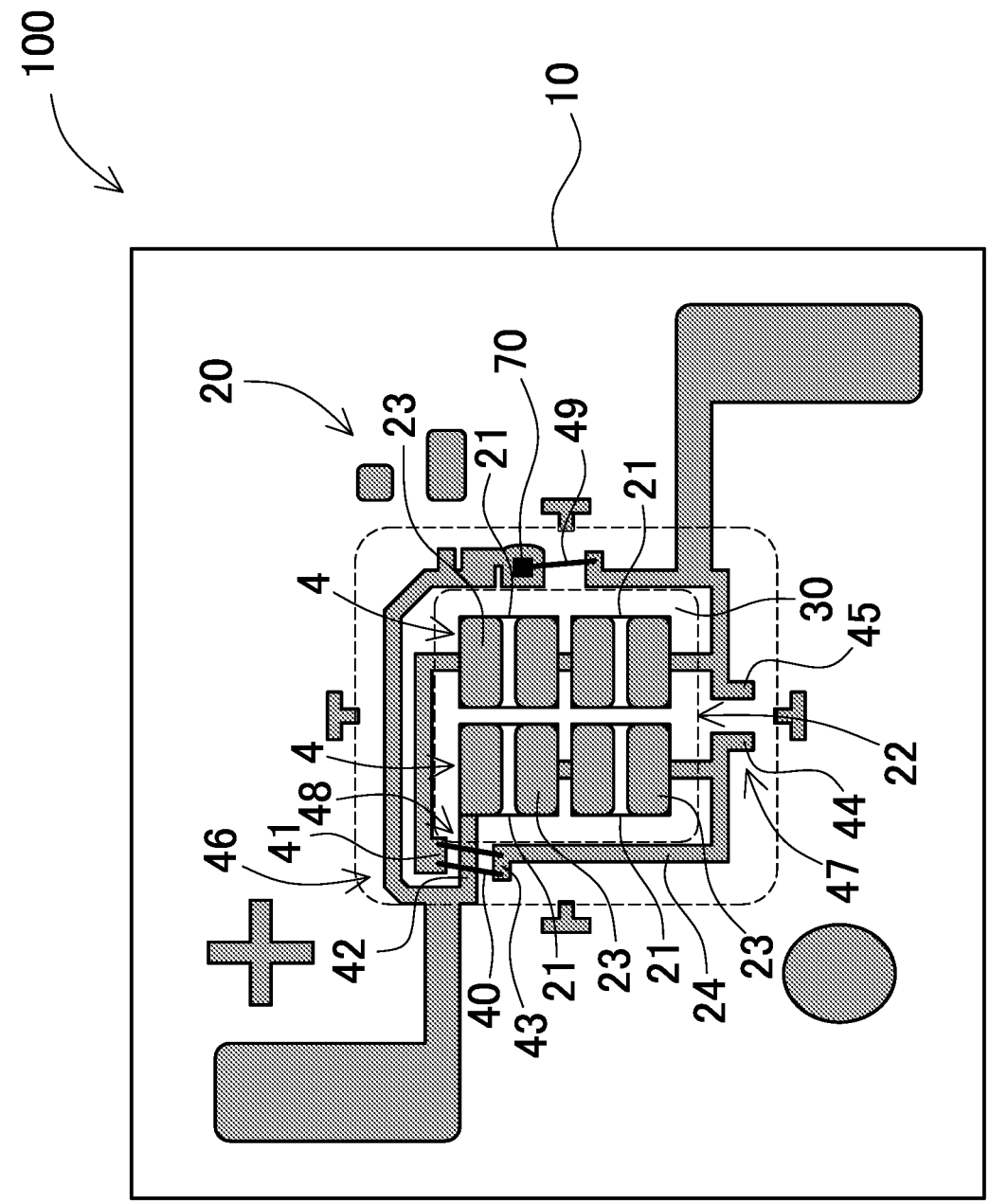
FIG. 5 is a schematic plan view showing an internal structure of an illustrative wiring in which four light-emitting elements are connected in a four-series configuration on the mounting board in FIG. 1.
Figure 6:
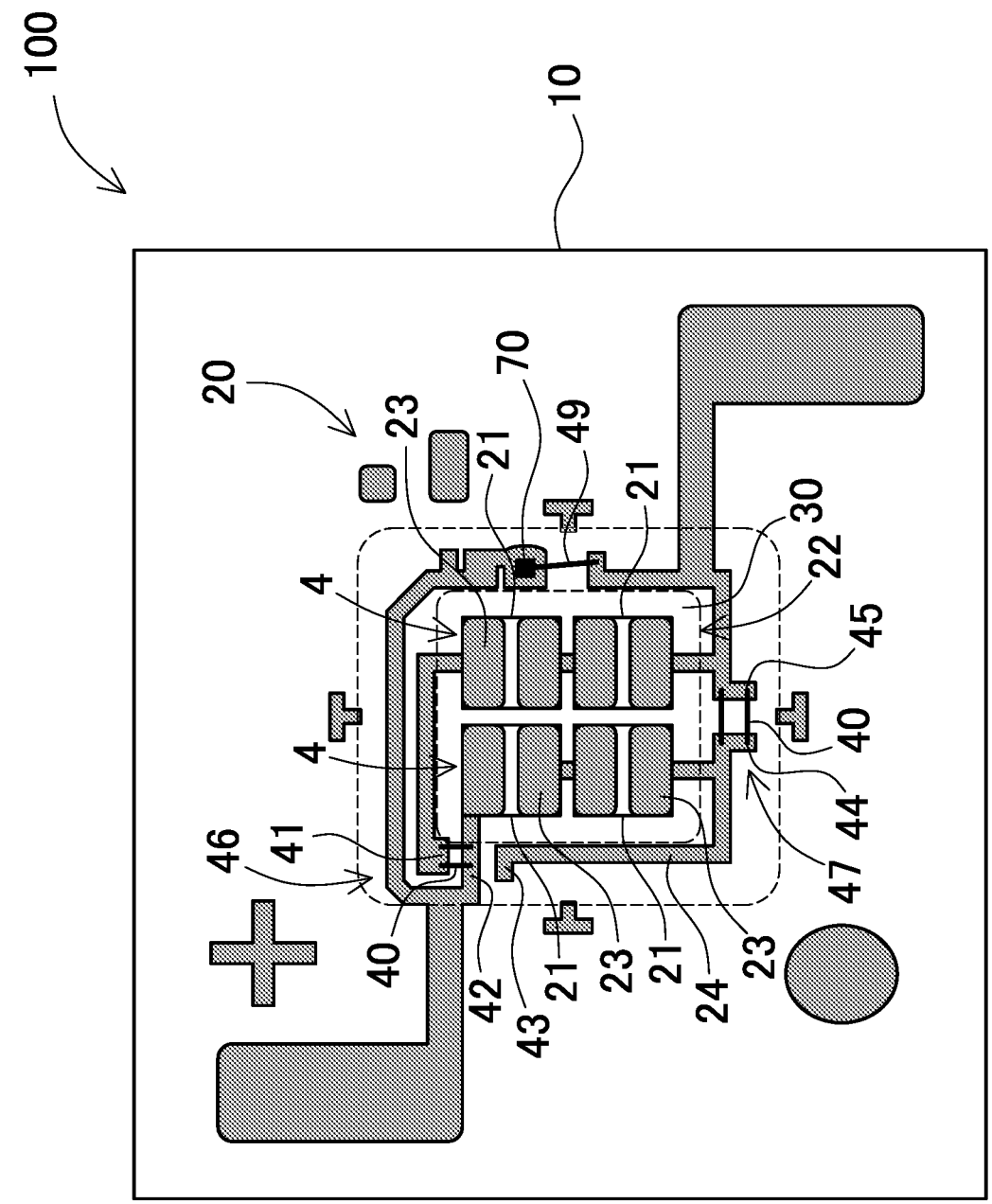
FIG. 6 is a schematic plan view showing an internal structure of an illustrative wiring in which the four light-emitting elements are connected in a two-series/two-parallel configuration on the mounting board in FIG. 1.

FIG. 1 to FIG. 6 schematically show a light-emitting device according to a first embodiment of the present invention. Among these drawings, FIG. 1 is a schematic plan view of a light-emitting device 100 according to the first embodiment, FIG. 2 is a schematic cross-sectional view taken along the line II-II of FIG. 1, FIG. 3 is a schematic plan view showing the internal structure of a mounting board 10 in FIG. 1, FIG. 4 is a schematic bottom view of electrodes of an LED in FIG. 1, FIG. 5 is a schematic plan view showing the internal structure of an illustrative wiring in which four light-emitting elements are connected in a four-series configuration on the mounting board in FIG. 1, and FIG. 6 is a schematic plan view showing the internal structure of an illustrative wiring in which the four light-emitting elements are connected in a two-series/two-parallel configuration on the mounting board in FIG. 1. A light-emitting device 100 shown in these drawings includes a mounting board 10, a plurality of light-emitting elements 1, a first reflective member 30, wires 40, a second reflective member 50, and a covering member 60.

The mounting board 10 has a board main surface on its upper surface. A predetermined wiring pattern 20 is formed on the board main surface. The mounting board 10 includes an insulating base material and the wiring pattern 20, on which the light-emitting elements 1 are mounted, on a surface of the base material. Examples of the insulating base material constituting the mounting board 10 include ceramics and resins (including resins such as a glass epoxy resin containing a reinforcing agent). Examples of a ceramic substrate include alumina and aluminum nitride substrates. Examples of the resin include thermosetting resins such as an epoxy resin, a silicone resin, a BT resin, and a polyimide resin and thermoplastic resins such as a polyphthalamide resin and a nylon resin. The base material can have a single-layer structure or a layered structure. An aluminum nitride single-layer board is employed in this example. Aluminum nitride generally has higher heat dissipation performance than resin. With aluminum nitride used for the base material, the heat dissipation performance of the light-emitting device can be improved. A colorant, filling material, or reinforcing agent known in the art can be mixed in these base materials. In particular, a colorant is preferably made of a material having a good reflectance, and a white material, such as titanium oxide or zinc oxide, is preferable. Examples of the filling material include silica and alumina. Examples of the reinforcing agent include glass, calcium silicate, and potassium titanate.

The first reflective member 30 is also disposed on the surface of the base material in the example shown in FIG. 2 (the details will be described later). The wiring pattern 20 is an electrically conductive member. The wiring pattern 20 is made of a metal material such as copper. In the present example, Cu with a thickness of 30 μm formed by electroplating and Ni/Pd/Au formed by electroless plating are employed. With the Cu layer being thick, the current capacity and the reflectance are obtained.

Light-Emitting Element 1

A plurality of light-emitting elements 1 are mounted on the wiring pattern 20. The light-emitting elements 1 are connected in series and/or in parallel through the wiring pattern 20. Hence, the wiring pattern 20 predefines mounting positions 21 each of which a respective one of the light-emitting elements 1 is disposed at. In schematic plan view showing the internal structures such as FIG. 5 and FIG. 6, the mounting positions 21 are indicated by frames. In these examples, four mounting positions 21 are arranged in a matrix to form a mounting region 22 for the light-emitting elements 1. The light-emitting elements 1 can be electrically connected in series and/or in parallel by mounting the light-emitting elements 1 at the mounting positions 21.

Electrically Conductive Member

Each light-emitting element 1 is flip-chip mounted on the wiring pattern 20 with electrically conductive members therebetween. Bumps made of Au or its alloy can be used for the electrically conductive members, and examples of other electrically conductive members include eutectic solder (Au—Sn), Pb—Sn, and lead-free solder. The electrically conductive members are not limited to bumps but can be made of, for example, electrically conductive paste.

Each light-emitting element 1 includes positive and negative terminals on its back surface as shown in FIG. 4. The wiring pattern 20 includes element connection regions 23 spaced away from each other in accordance with the distance between the positive and negative electrodes of the light-emitting element 1 so that the light-emitting elements 1 can be mounted at the mounting positions 21 and connected in series and/or in parallel. The orientation (referred to as the "posture" here) of each light-emitting element 1 mounted at the mounting position 21 in the rotational direction at the time of mounting is restricted to a certain direction. In the examples shown in FIG. 5 and FIG. 6, flip-chip mounting has been performed such that a p-electrode 2 is located on the upper side and such that an n-electrode 3 is located on the lower side in each element connection region 23. Accordingly, the connection pattern of the wiring pattern 20 shown in FIG. 5 establishes a series connection shown in FIG. 7, and the connection pattern of the wiring pattern 20 shown in FIG. 6 establishes series and parallel connections shown in FIG. 8.

A light-emitting diode is preferably used for the light-emitting element 1, and an element that emits light with any appropriate wavelength can be selected according to the intended use. For example, a nitride semiconductor (In$_X$Al$_Y$Ga$_{1-X-Y}$N, where 0≤X, 0≤Y, and X+Y≤1), which can emit light with short wavelengths that can efficiently excite a wavelength conversion member 62 described later, can be used. The emission wavelength can be selected by changing the materials for the semiconductor layer and their mixing ratio. The light-emitting element 1 has a dominant wavelength within the range of 380 nm or more and 470 nm or less.

Wire 40

Each of the wires 40 electrically connects a portion of the wiring pattern 20 to another portion of the wiring pattern 20.

The connection by the wiring pattern 20 can be changed by changing the position at which a portion of the wiring pattern 20 is electrically connected to another portion by the wire 40. A material such as Au, Cu, Ag, or Al can be used for the wire 40.

Also, a plurality of wires 40 connect a portion of the wiring pattern 20. With this structure, the load on each wire can be reduced and also reliability against disconnection or the like can be improved. In the examples shown in FIG. 5 and FIG. 6, two wires 40 are disposed on a wire connection region.

First Reflective Member 30

The first reflective member 30 covers a region of the mounting board 10 in which the wiring pattern 20 is not formed, that is, the region other than the wiring pattern 20, as shown in the schematic cross-sectional view of FIG. 2. The first reflective member 30 reflects a component of light emitted from the light-emitting elements 1, the component traveling toward the board main surface of the mounting board 10, to increase the light extraction efficiency on the emission main surface. Particularly in the case in which a light-transmissive material is used for the base material of the mounting board 10, the board main surface is covered with the first reflective member 30 except for the portion on which the electrically conductive wiring pattern 20 is to be exposed so that light emitted from the light-emitting elements 1 toward the lower surface does not leak out from the back surface through the mounting board 10. Examples of the first reflective member 30 include a white resist in which white particles with a high reflectance is dispersed in resin. A silicone resin, an epoxy resin, a fluorocarbon resin, or the like can be used for the resin material, and titanium oxide, silica, or the like can be used for the filler. For example, a white resist is formed on the mounting board 10 by printing.

Wiring Pattern 20

The wiring pattern 20 defines the connection pattern to connect a plurality of light-emitting elements 1 in series and/or in parallel. An ordinary wiring pattern is predefined to a certain pattern and cannot be usually changed to a different connection pattern. On the other hand, in the light-emitting device 100 according to the present embodiment, the pattern can be changed to a different connection pattern because part of the wiring pattern 20 is connected by the wires 40. The light-emitting device 100 according to the present embodiment includes the fixed wiring pattern 20 formed on the mounting board 10, but the pattern can be changed to a connection pattern with different numbers of series connections and parallel connections when a plurality of light-emitting elements are connected in series and/or in parallel by changing the positions of connection by the wires 40. The number of series connections or the number of parallel connections includes one. That is, the number of parallel connections is one in the case in which only series connections are included, and the number of series connections is one in the case in which only parallel connections are included.

Wire Connection Region

The wiring pattern 20 includes wire connection regions in which the wires 40 are put. The wiring pattern 20 includes a plurality of wire connection regions, and switching between series connections and parallel connections of the light-emitting elements 1 can be performed by connecting some of the wire connection regions and leaving other wire connection regions unconnected to change the path of electric conduction by the wiring pattern 20. Hence, the wiring pattern 20 predefines a plurality of connection patterns each of which connects a predetermined number of light-emitting elements in series and a predetermined number of light-emitting elements in parallel among a plurality of light-emitting elements 1 mounted on the wiring pattern 20. Any of these connection patterns can be selected by selecting wire connection regions to be connected by the wires 40 and other wire connection region to be left unconnected among the wire connection regions. The statement "portions of the wiring pattern are connected by the wires" as used in the present specification refers to the form in which a plurality of wire connection region in such a wiring pattern are connected by wires.

Each wire connection region is a portion of the wiring pattern 20 and is constituted such that two or more wire connection regions are close to each other but are spaced away from each other, that is, insulated from each other. The distance between the wire connection regions spaced away from each other is configured such that the wire connection regions can be connected by the wires 40. That is, the distance is in the range in which wire bonding with a wire bonder can be performed.

For example, in the wiring pattern 20 shown in FIG. 3, a first wire connection region 41, a second wire connection region 42, and a third wire connection region 43 are disposed close to one another to constitute a first group 46 of connection regions. The first group 46 of connection regions is located at the upper left of the mounting region 22 for the light-emitting elements 1, constituted of four mounting positions 21. On the other hand, as other wire connection regions, a fourth wire connection region 44 and a fifth wire connection region 45 are disposed close to each other to constitute a second group 47 of connection regions located at the center of the lower part of the mounting region 22.

Figure 7:
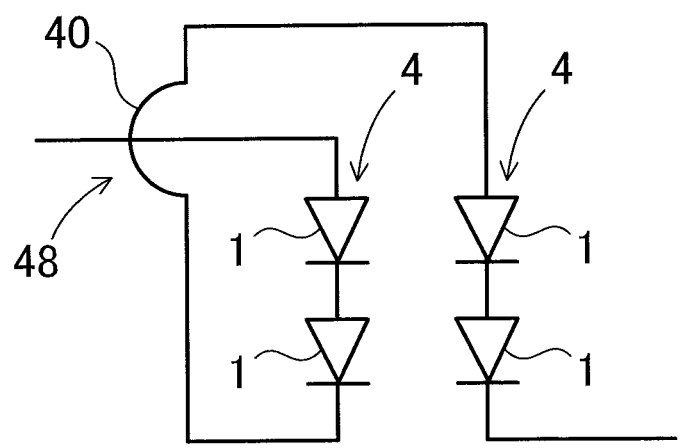
FIG. 7 is a circuit diagram showing the state of connection between the light-emitting elements in FIG. 5.

In FIG. 5, in the first group 46 of connection regions, the first wire connection region 41 is connected to the third wire connection region 43 by wires 40 astride the second wire connection region 42, while the second group 47 of connection regions is not connected by wires, so that the four light-emitting elements 1 respectively mounted at the mounting positions 21 of the wiring pattern 20 can be connected in series as shown in the circuit diagram of FIG. 7.

Figure 8:
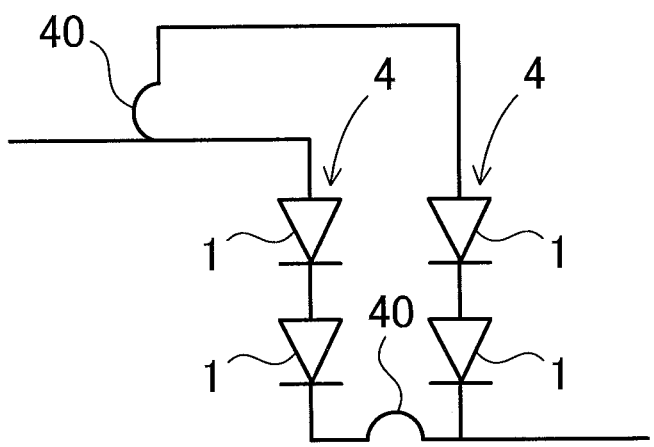
FIG. 8 is a circuit diagram showing a state of connection between the light-emitting elements in FIG. 6.

On the other hand, in FIG. 6, the first wire connection region 41 is connected to the second wire connection region 42 by wires 40 in the first group 46 of connection regions, and the fourth wire connection region 44 is connected to the fifth wire connection region 45 by wires 40 in the second group 47 of connection regions, so that the four light-emitting elements 1 respectively mounted at the mounting positions 21 of the wiring pattern 20 can be connected in a two-series/two-parallel configuration in which two rows 4 of light-emitting elements each including two light-emitting elements 1 connected in series (two-series) are connected in parallel (two-parallel) as shown in the circuit diagram of FIG. 8. By combining the ways of connecting the wires or selecting portions in which the wires do not connect in each group of connection regions as described above, rearrangement to a different connection pattern of a plurality of light-emitting elements can be performed using the same wiring pattern. With this structure, a common wiring pattern can be adapted to different connection patterns instead of providing respective wiring patterns according to connection patterns for a plurality of light-emitting elements, so that reduction in the manufacturing costs using a common member and reduction of labor such as design of members and maintenance are expected.

Extending Portion 24

The wiring pattern 20 includes an extending portion 24 elongated in a linear fashion. The extending portion 24 is located on the peripheral side of the wiring pattern 20. In other words, the extending portion 24 is not located between the mounting positions 21 defined on the wiring pattern 20 but outside the mounting positions 21. If wiring 94 is located between rows 90 of light-emitting elements formed by connecting light-emitting elements 91 in series, distances between the rows 90 of light-emitting elements increase, and the emission pattern of the light-emitting device including a plurality of light-emitting elements becomes unlike the emission pattern of a point source. To obtain an emission pattern close to the emission pattern of a point source, intervals between light-emitting elements are preferably as small as possible. However, spaces for the wiring 94 are required between adjacent rows 90 of light-emitting elements in order to connect the rows 90 of light-emitting elements in series, and these have been in the trade-off relation.

On the other hand, in the light-emitting device 100 according to the present embodiment, the extending portion 24 is not located between the adjacent rows 4 of light-emitting elements but is located outside the mounting positions 21, that is, outside the mounting region 22. However, portions of such a wiring pattern 20 intersect with each other, which prevents connection. Hence, a connection is established using the wires 40 leaping over a portion of the wiring pattern 20 as shown in FIG. 5 in the present embodiment. The wiring pattern 20 includes a wire intersection region 48 above which wires 40 intersect as described above, so that an electrical connection in which wire connection regions of the wiring pattern 20 are connected can be established by stretching the wires 40 over the wire intersection region 48 to intersect in an insulated state without allowing the portions of the wiring pattern 20 formed on the mounting board 10 to intersect each other. Accordingly, a constitution in which the adjacent rows 4 of light-emitting elements are connected in series without passing wiring between the rows 4 of light-emitting elements is provided.

On the other hand, in the light-emitting device 100 according to the present embodiment, not only series connections but also parallel connections of the rows of light-emitting elements can be established using the same wiring pattern 20. As described above, switching between such a series connection pattern and a parallel connection state can be performed by selecting a combination of connections of the wire connection regions in the groups of connection regions by the wires 40.

The extending portion 24 can have the function of intercepting the first reflective member 30 in addition to such a function of providing an electrical connection path. Hence, the extending portion 24 has a thickness equal to or greater than the thickness of the first reflective member 30. With this structure, the wiring pattern 20 can include the extending portion 24 that is not used for electrical connections, and the extending portion can be effectively used to intercept a light-reflective resin. As shown in the schematic cross-sectional view of FIG. 2, the wiring pattern 20 including the extending portion 24 and having a predetermined thickness is formed on the board main surface of the mounting board 10. On the other hand, the first reflective member 30 is disposed on the mounting board 10 except for the portion in which the wiring pattern 20 is to be exposed as described above. To form the first reflective member 30 on the mounting board 10, unhardened resin is disposed on the board main surface by printing, application, or the like. At this time, the extending portion 24 can function as a dam that intercepts diffusion or exudation of the resin to prevent the unhardened resin from spreading to an unintended region. As described above, the extending portion 24 can also be used for interception of the first reflective member 30 in addition to electrical connection. In this example, the white resist constituting the first reflective member 30 is polished after being printed, and the wiring pattern is plated. The thickness of the region with the wiring pattern increases by the thickness of the plating.

Second Reflective Member 50

The second reflective member 50 covers the upper surface of the mounting board 10 so as to surround a plurality of light-emitting elements 1. As shown in the schematic cross-sectional view of FIG. 2, the second reflective member 50 is formed into a frame. The second reflective member 50 can be made of white resin.

The second reflective member 50 preferably covers the wiring pattern 20 including the wires 40 as shown in FIG. 3. With this structure in which the wires 40 that are used to switch between the connections are embedded in the second reflective member 50, mechanical stability such as impact resistance of the wires 40 can be improved.

Covering Member 60

The covering member 60 covers the circumferences and upper surfaces of the light-emitting elements 1. The covering member 60 is filled into the frame constituted of the second reflective member 50 to seal the members inside the frame. The covering member 60 contains resin. Examples of the resin include a phenolic resin, an epoxy resin, a bismaleimide-triazine resin, a polyphthalamide resin, and a silicone resin. The covering member 60 contains the wavelength conversion member 62 (the details will be described later) in the resin.

Underfill can be used in addition to the covering member 60. The underfill protects the light-emitting elements 1, the electrically conductive members, and other components disposed on the mounting board 10 against dust, water, external forces, and the like. The underfill can be disposed between the light-emitting elements 1 and the mounting board 10. Examples of the material of the underfill include a silicone resin and an epoxy resin. In addition to such a material, the underfill can contain materials such as a colorant, a light-diffusing agent, a filler, and a fluorescent member as appropriate. With the underfill disposed between the light-emitting elements 1 and the mounting board 10 as described above, light leaking out from the lower surfaces of the light-emitting elements 1 can be reflected toward the light-emitting elements 1 and the wavelength conversion member 62, so that light extraction efficiency from the upper surface of the light-emitting device can be increased. Further, by mixing a colorant, a light-diffusing agent, a filler, a fluorescent member, or the like in the underfill, the effect of reducing light to be transmitted through the covering member 60 before the covering member 60 is enhanced, so that variations in chromaticity depending on the observation azimuth of emission of light from the light-emitting device can be reduced.

Wavelength Conversion Member 62

A phosphor can be suitably used for the wavelength conversion member 62. Examples of the phosphor include a phosphor represented by the composition formula $(Sr,Ca)AlSiN_3$:Eu and a phosphor represented by the composition formula $(Ca,Sr,Ba)_2Si_5N_8$:Eu. Examples of a phosphor that emits red light include $(Ca,Sr,Ba)S$:Eu, $K_2(Si,Ti,Ge)F_6$:Mn, $3.5MgO\cdot0.5MgF_2\cdot GeO_2$:Mn, and $(Sr,Ca)LiAl_3N_4$:Eu. Except for special cases, a plurality of elements marked off by commas (,) in a composition formula representing the composition of a phosphor indicate that at least one of these elements is contained in the composition, and two or more of these elements can be contained in combination. In a formula representing the composition of a phosphor in the present specification, letters and numbers before a colon (:) represent elements constituting a host crystal and their molar ratios, and letters after the colon (:) represent the activating element. The term "molar ratio" represents the molar quantity of an element per one mole of the composition of the phosphor.

Two or more types of phosphors can be contained as the wavelength conversion member 62. For example, phosphors represented by the composition formulas $(Sr,Ca)AlSiN_3$:Eu (hereinafter may be abbreviated to "SCASN" in the specification) and $(Ca,Sr,Ba)_2Si_5N_8$:Eu can be used.

Further, a YAG phosphor (hereinafter may be abbreviated to "YAG" in the specification) with the composition $(Lu,Y,Gd,Tb)_3(Al,Ga)_5O_{12}$:Ce can be used.

Examples of another phosphor that can be additionally used include $Si_{6-z}Al_zO_zN_{8-z}$:Eu(0<z<4.2), $Ca_3Sc_2Si_3O_{12}$:Ce, $CaSc_2O_4$:Ce, $(La,Y,Gd)_3(Al,Si)_6N_{11}$:Ce, $(Ca,Sr,Ba)_8MgSi_4O_{16}(F,Cl,Br)_2$:Eu, $(Ca,Sr,Ba)_3Si_6O_9N_4$:Eu, $(Ca,Sr,Ba)_3Si_6O_{12}N_2$:Eu, $(Ba,Sr,Ca)Si_2O_2N_2$:Eu, $(Ba,Sr,Ca,Mg)_2SiO_4$:Eu, $(Ba,Sr,Ca)Ga_2S_4$:Eu, $(Ca,Sr,Ba,Mg)_{10}(PO_4)_6(F,C,Br,I,OH)_2$:Eu, $(Ba,Sr,Ca)_3MgSi_2O_8$:Eu, $Sr_4Al_{14}O_{25}$:Eu, and $(Si,Al)_6(O,N)_8$:Eu.

The wavelength conversion member 62 is preferably dispersed in the covering member 60. For example, when the light-emitting device is manufactured, the wavelength conversion member 62 can be formed in the form of a layer on the surface of each light-emitting element 1 as shown in FIG. 2 by filling the region surrounded by the second reflective member 50 with a resin constituting the covering member 60 containing a phosphor as the wavelength conversion member 62 and sedimenting the phosphor. Alternatively, the wavelength conversion member 62 can be uniformly dispersed in the covering member 60. Such an arrangement of the wavelength conversion member 62 can be adjusted by, for example, the viscosity of the unhardened resin constituting the covering member 60.

In the embodiment of the present invention, the wavelength conversion member is not limited to a phosphor mixed in the covering member 60 but can be, for example, a combination of a plate-like phosphor layer made of resin and a light-transmissive body such as glass, a phosphor ceramic made by sintering a mixture of a phosphor and a ceramic, a phosphor sheet made by mixing a phosphor in resin and forming the mixture into a sheet, or glass containing a phosphor.

Protective Element 70

The light-emitting device 100 further includes a protective element 70 on a portion of the wiring pattern 20. The protective element 70 protects the light-emitting elements 1 against static electricity and high voltage surges. The specific examples include a Zener diode. To reduce absorption of light, the protective element 70 can be covered with a light-reflective member (second reflective member 50) such as white resin. In the examples shown in FIG. 5 and FIG. 6, the upper surface of the protective element 70 is electrically connected to the wiring pattern 20 by a wire 49.

Second Embodiment

Figure 9:
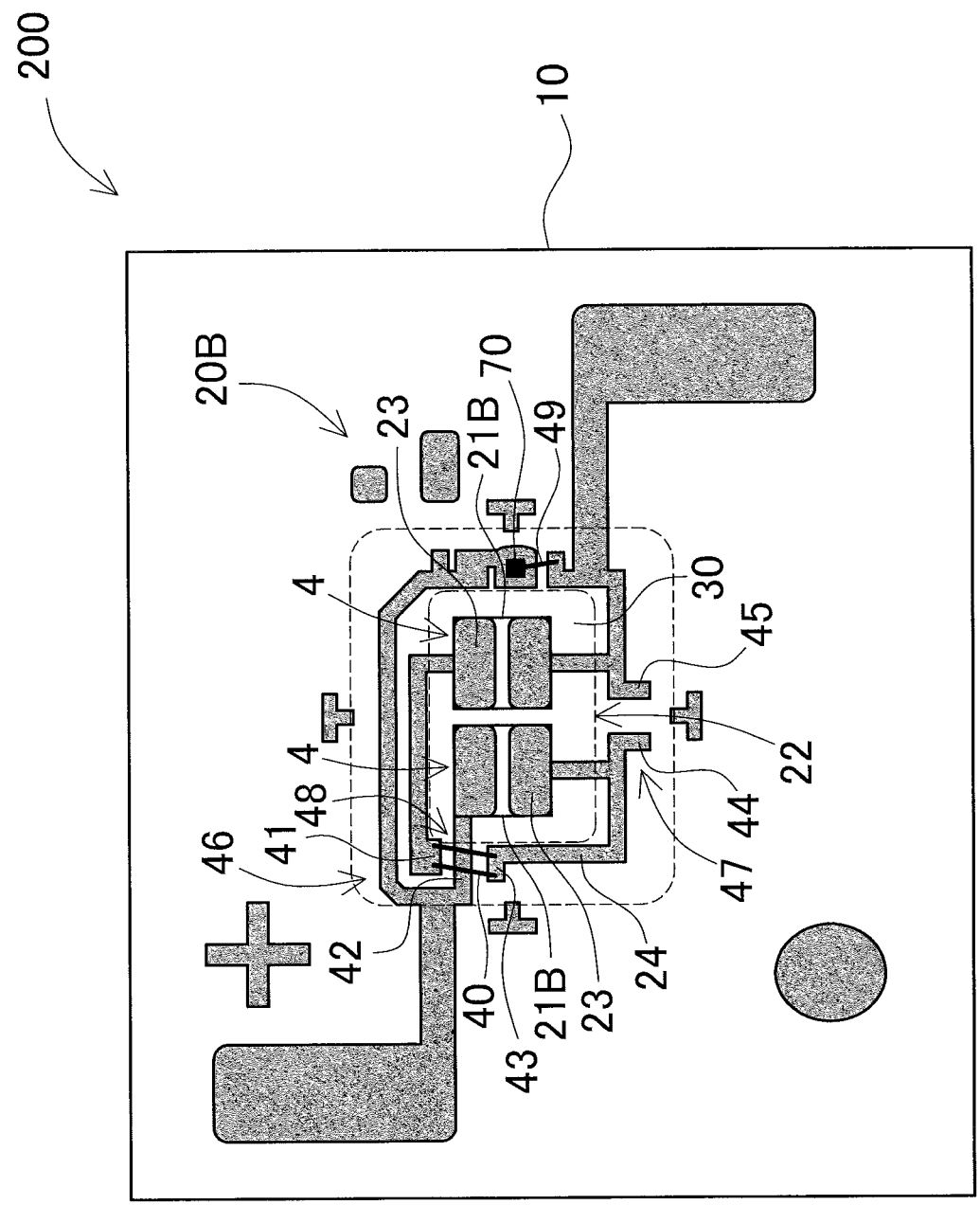
FIG. 9 is a schematic plan view showing an internal structure of a light-emitting device according to a second embodiment.

An embodiment in which four light-emitting elements 1 are arranged in a two-by-two matrix has been described above, but the number of light-emitting elements, the number of rows, the number of columns, and the wiring pattern of certain embodiments of the present invention are not limited by the above embodiment. That is, five or more light-emitting elements can be connected in series and/or in parallel, or three or less light-emitting elements can be used. The combination of series connections and parallel connections is not required, and only series connections or only parallel connections can constitute the connection pattern. For example, a light-emitting device 200 according to a second embodiment shown in FIG. 9 includes two light-emitting elements 1, and mounting positions 21B of a wiring pattern 20B are arranged in a one-by-two matrix. Also in the light-emitting device 200, similarly to the first embodiment, the first wire connection region 41 is connected to the third wire connection region 43 by wires 40 astride the second wire connection region 42 in the first group 46 of connection regions, while the second group 47 of connection regions is not connected by wires, so that the two light-emitting elements 1 respectively mounted at the mounting positions 21 of the wiring pattern 20 can be connected in series. On the other hand, when the first wire connection region 41 is connected to the second wire connection region 42 by wires 40 in the first group 46 of connection regions, and the fourth wire connection region 44 is connected to the fifth wire connection region 45 by wires 40 in the second group 47 of connection regions, the two light-emitting elements 1 can be connected in parallel. As described above, the wiring pattern 20B offers a pattern including only a series connection and a pattern including only a parallel connection as a plurality of connection patterns, and switching between these patterns can be performed by changing the portions connected by the wires.

Third Embodiment

Figure 10:
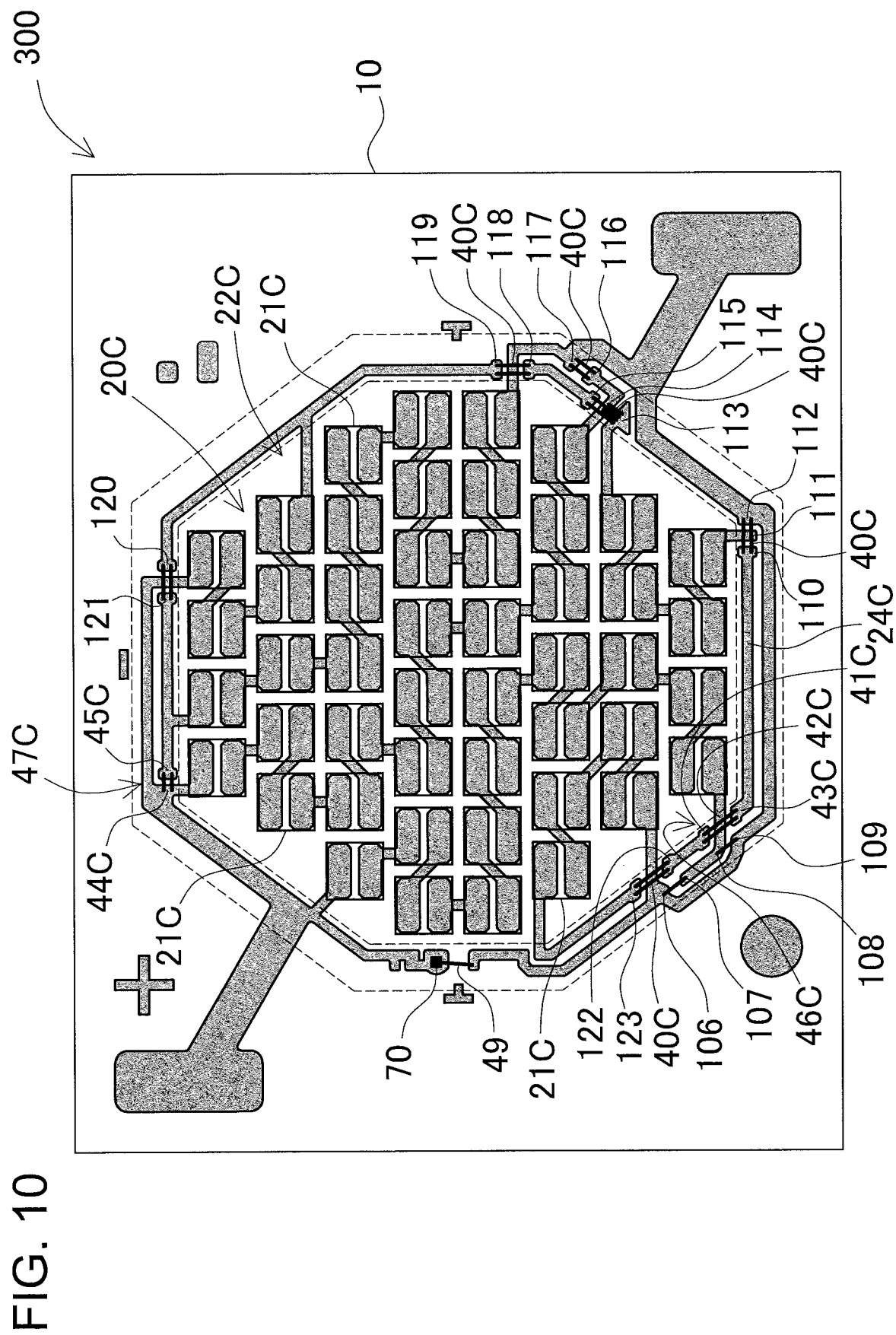
FIG. 10 is a schematic plan view showing an internal structure of a light-emitting device according to a third embodiment.
Figure 11:
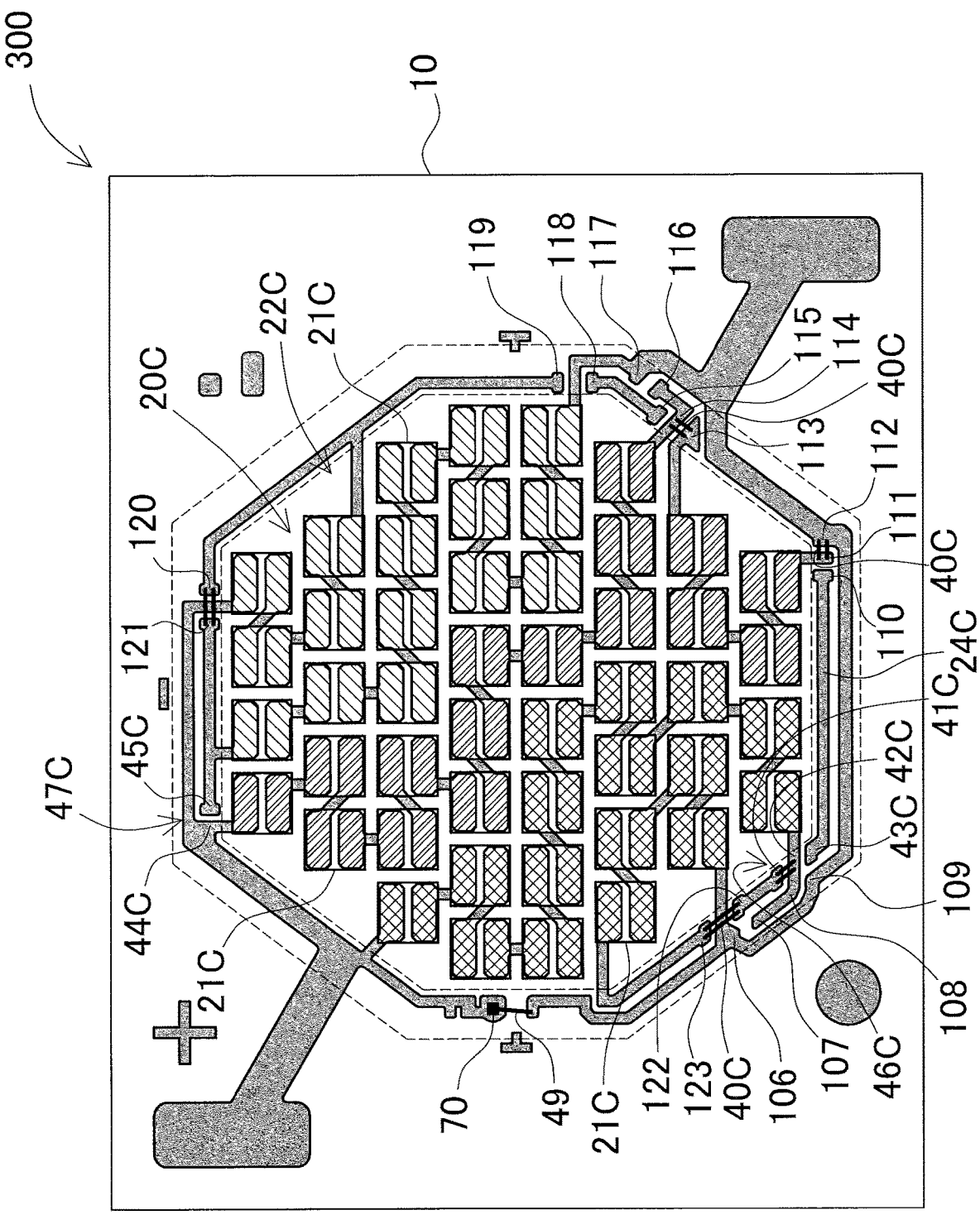
FIG. 11 is a schematic plan view showing an internal structure of an illustrative wiring in which 48 light-emitting elements are connected in a 16-series/3-parallel configuration on a mounting board in FIG. 10.
Figure 12:
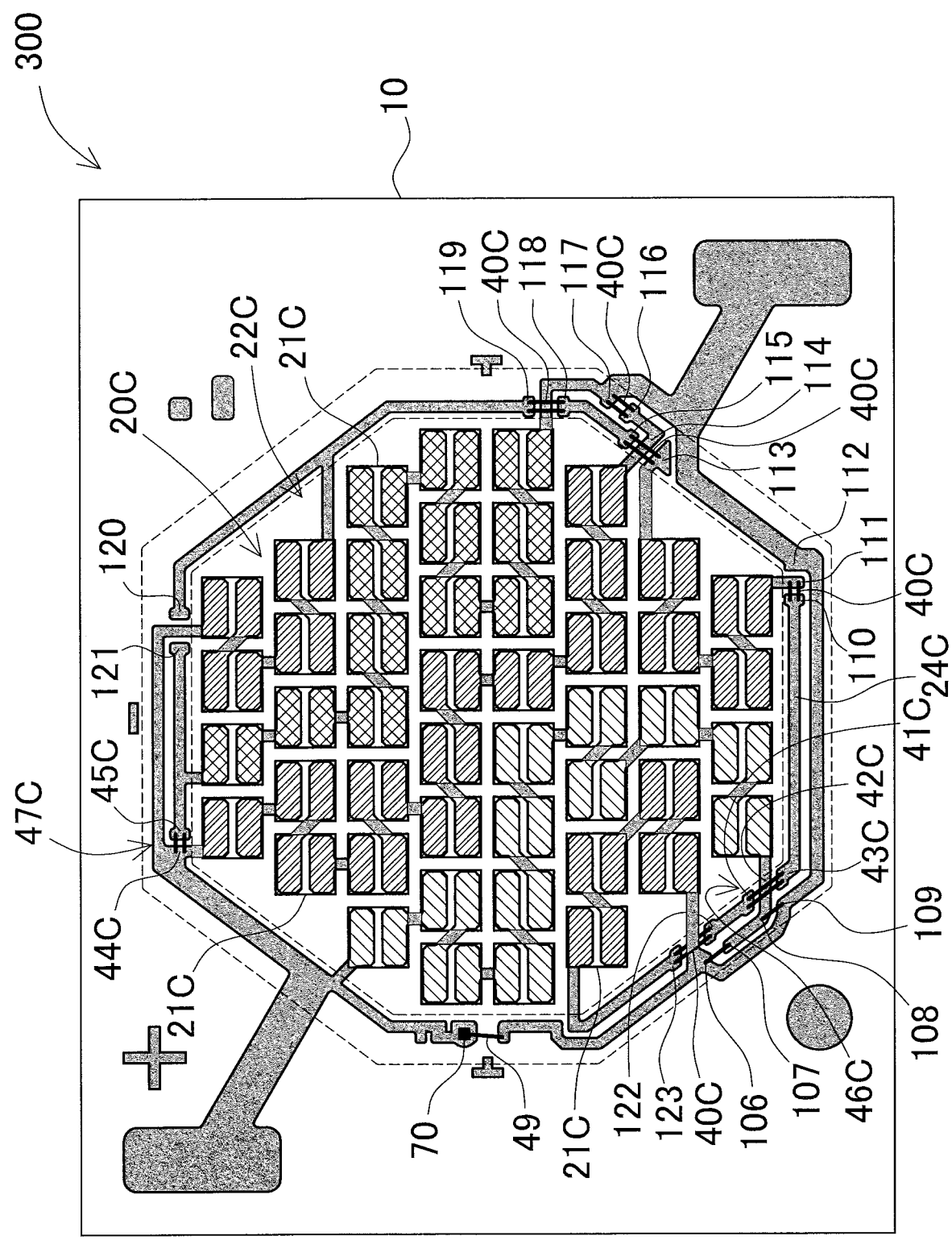
FIG. 12 is a schematic plan view showing an internal structure of an illustrative wiring in which the 48 light-emitting elements are connected in a 12-series/4-parallel configuration on the mounting board in FIG. 10.
Figure 13:
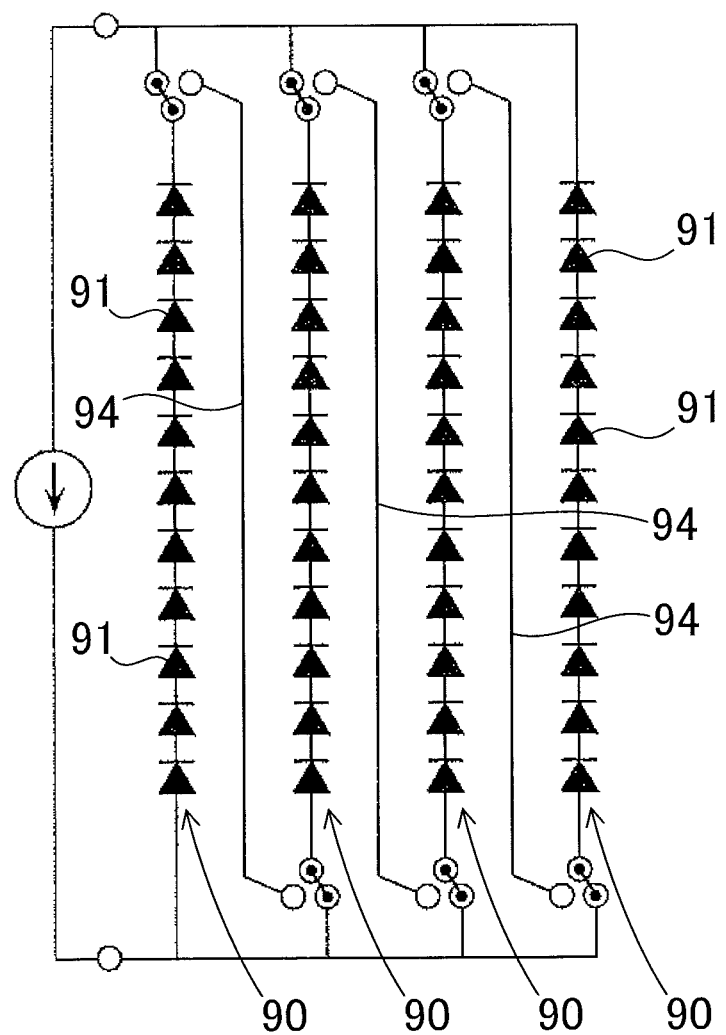
FIG. 13 is a schematic plan view of a related art wiring pattern.

The arrangement of the mounting positions 21 in the wiring pattern 20 is not limited to a matrix but can be a staggered pattern, an obliquely crossing pattern, a single ring, multiple rings, or a spiral pattern. The outer shape of the mounting region 22 can be a polygonal shape such as a quadrilateral shape or an octagonal shape or a circular or elliptic shape. Further, a plurality of connection patterns that can be switched by connecting portions of the wiring pattern by wires are not limited to only the series connection shown in FIG. 5 and the series and parallel connections shown in FIG. 6, and a connection pattern with different numbers of series connections and parallel connections can be selected among connection patterns connecting light-emitting elements in series and in parallel. In this sense, the example shown in FIG. 5 can be regarded as selection of a connection pattern of a four-series/one-parallel configuration, and the example shown in FIG. 6 can be regarded as selection of a connection pattern of a two-series/two-parallel configuration. Further, the row of light-emitting elements does not necessarily have to be straight and linear but can be partially bent or curved. FIG. 10 shows a light-emitting device 300 according to a third embodiment as an example. In the light-emitting device 300 shown in this drawing, 4, 5, 7, 8, 8, 7, 5, and 4 mounting positions 21C constituting a wiring pattern 20C are aligned in the lateral direction, and the rows are aligned in the longitudinal direction at regular intervals, so that the 48 mounting positions 21C form an octagonal shape as a whole. In such a wiring pattern 20C, either of a connection pattern of a 16-series/3-parallel configuration as shown in FIG. 11 and a connection pattern of a 12-series/4-parallel configuration as shown in FIG. 12 can be selected by selecting the portions connected by the wires. To increase noticeability, the same hatch pattern is applied to a plurality of light-emitting elements connected in series to constitute rows of light-emitting elements in these drawings. The rows of light-emitting elements are not straight and linear but are bent to be fitted into an octagonal mounting region 22C.

In an example in which the connection pattern shown in FIG. 12 is selected, a first wire connection region 41C is connected to a third wire connection region 43C by wires 40 astride a second wire connection region 42C in a first group 46C of connection regions, and a fourth wire connection region 44C is connected to a fifth wire connection region 45C by wires 40 in a second group 47C of connection regions. Further, a sixth wire connection region 106 and a seventh wire connection region 107, an eighth wire connection region 108 and a ninth wire connection region 109, a tenth wire connection region 110 and an eleventh wire connection region 111, a thirteenth wire connection region 113 and a fifteenth wire connection region 115, a sixteenth wire connection region 116 and a seventeenth wire connection region 117, and an eighteenth wire connection region 118 and a nineteenth wire connection region 119 are connected to each other by wires 40, while a twentieth wire connection region 120 and a twenty-first wire connection region 121 are not connected by wires, so that 48 light-emitting elements respectively mounted at the mounting positions 21C of the wiring pattern 20C are connected in a 12-series/4-parallel configuration. Also in this example, an extending portion 24C is not located between the rows of light-emitting elements but outside the mounting region 22C.

On the other hand, in an example in which the connection pattern shown in FIG. 11 is selected, the first wire connection region 41C is connected to the second wire connection region 42C by wires 40 in the first group 46C of connection regions, while the fourth wire connection region 44C is not connected to the fifth wire connection region 45C by wires in the second group 47C of connection regions. Further, the eleventh wire connection region 111 and a twelfth wire connection region 112, the thirteenth wire connection region 113 and a fourteenth wire connection region 114, and the twentieth wire connection region 120 and the twenty-first wire connection region 121 are connected to each other by wires 40, while the other wire connection regions are not connected by wires, so that the 48 light-emitting elements respectively mounted at the mounting positions 21C of the wiring pattern 20C are connected in a 16-series/3-parallel configuration.

In both connection patterns shown in FIG. 11 and FIG. 12, a twenty-second wire connection region 122 and a twenty-third wire connection region 123 are connected by wires 40C. As described above, not all the portions connected by the wires have to be different in different connection patterns, but part of the portions connected by the wires can be the same. Particularly in a portion in which a leap of wiring is required, a wire intersection region using wires can be employed as appropriate to increase the flexibility of the wiring pattern.

With the mounting board 10 provided with the common wiring pattern 20, switching between series connections and parallel connections can be performed and the necessity of providing mounting boards 10 having different wiring patterns 20 in accordance with the connection patterns can be eliminated. With the structure, rows of light-emitting elements can be disposed close to each other without a wiring pattern running between the rows of light-emitting elements, so that a lighting pattern close to the lighting pattern of a point source can be obtained. Further, with the light-emitting elements 1 connected in series and/or in parallel through the wiring pattern 20, the amount of wires to be used can be reduced, so that absorption of light by the wires can be reduced.

The light-emitting devices according to the present invention can be used as what are called chip on board (COB) devices for lighting apparatuses, spotlights, headlights, backlight devices for liquid-crystal displays, large sized displays, and various displays for advertisements or destination guide, as well as image scanners for digital video cameras, facsimile machines, copying machines, and scanners, projectors, and other apparatuses.

It should be apparent to those with an ordinary skill in the art that while various preferred examples of the invention have been shown and described, it is contemplated that the invention is not limited to the particular examples disclosed, which are deemed to be merely illustrative of the inventive concepts and should not be interpreted as limiting the scope of the invention, and which are suitable for all modifications and changes falling within the spirit and scope of the invention as defined in the appended claims.

What is claimed is:

1. A light-emitting device comprising:
 a mounting board having an upper surface provided with a device-mounting pattern thereon;
 a plurality of light-emitting elements, each of which is a flip-chip light-emitting element that is mounted on the device-mounting pattern and connected in series and/or in parallel through the device-mounting pattern; and
 at least one wire electrically connecting a part of the device-mounting pattern to another part of the device-mounting pattern,
 wherein the device-mounting pattern comprises a plurality of wire connection regions, each of the wire connection regions being spaced apart from each other at a distance such that the connection regions are connected by the wire extending between the connection regions to alter one of a plurality of connection patterns by a wire connection between some of the plurality of wire connection regions while an interconnection between the plurality of light-emitting elements are kept unchanged, each of the plurality of connection patterns has different numbers of series connection and parallel connection of the light-emitting elements,
 wherein the at least one wire connects the wire connection regions jumping over at least a part of the device-mounting pattern,
 wherein a plurality of rows of the light-emitting elements are disposed on the device-mounting pattern, each row of the rows of the light-emitting elements being formed of a part of the light-emitting elements, and
 wherein the device-mounting pattern is not interposed between any adjacent rows of the plurality of rows of the light-emitting elements except for a connection between adjacent light-emitting elements.

2. A light-emitting device comprising:
 a mounting board having an upper surface provided with a device-mounting pattern thereon;
 at least one wire connecting lines of the device-mounting pattern; and
 a plurality of light-emitting elements, each of which is a flip-chip light-emitting element that is mounted on the device-mounting pattern,
 wherein the at least one wire jumps over at least a part of the device-mounting pattern,
 wherein a plurality of rows of light-emitting elements are aligned, each row of the rows of the light-emitting elements being formed of a part of the light-emitting elements connected in series,
wherein a wire bonded structure connects the rows of the light-emitting elements to each other in series on the device-mounting pattern, and
wherein the device-mounting pattern is not interposed between any adjacent rows of the plurality of rows of the light-emitting elements except for a connection between adjacent light-emitting elements.

3. A light-emitting device comprising:
a mounting board having an upper surface provided with a device-mounting pattern thereon, the device-mounting pattern having lines;
at least one wire connecting the lines of the device-mounting pattern; and
a plurality of light-emitting elements, each of which is a flip-chip light-emitting element that is mounted on the device-mounting pattern,
wherein the at least one wire jumps over at least a part of the device-mounting pattern,
wherein a plurality of rows of the light-emitting elements are aligned, each row of the rows of the light-emitting elements being formed of a part of the light-emitting elements connected in series,
wherein the at least one wire is a wire bonded structure that connects the rows of the light-emitting elements to each other in parallel on the device-mounting pattern, and
wherein the device-mounting pattern is not interposed between any adjacent rows of the plurality of rows of the light-emitting elements except for a connection between adjacent light-emitting elements.

4. The light-emitting device according to claim 1, wherein each row of the rows of the light-emitting elements is configured by connecting the light-emitting elements in series.

5. The light-emitting device according to claim 1, wherein the device-mounting pattern comprises a plurality of mounting positions, each of which is predefined and on which each of the light-emitting elements is disposed.

6. The light-emitting device according to claim 5, wherein each of the light-emitting elements is positioned on a mounting position of the mounting positions of the device-mounting pattern with a same posture.

7. The light-emitting device according to claim 1, further comprising a reflective member partially covering the upper surface of the mounting board to surround the light-emitting elements,
wherein the reflective member covers the device-mounting pattern and the wire.

8. The light-emitting device according to claim 1, wherein the wire is wire-bonded astride a portion of the device-mounting pattern such that the wire electrically connects two connection regions and such that the wire bonded structure extends over and is not connected to the portion of the device-mounting pattern.

9. The light-emitting device according to claim 1, wherein the light-emitting elements are arranged in a matrix.

10. The light-emitting device according to claim 1, wherein the at least one wire is a plurality of wires connecting the part of the device-mounting pattern to the another part of the device-mounting pattern.

11. The light-emitting device according to claim 1, further comprising a protective element disposed on the part of the device-mounting pattern.

12. The light-emitting device according to claim 1, wherein the connection patterns comprise series and parallel connection patterns with different numbers of series connections and parallel connections.

13. A mounting board for a light-emitting device having an upper surface, the mounting board comprising:
a device-mounting pattern on the upper surface such that a plurality of flip-chip light-emitting elements are capable of being mounted on the device-mounting pattern; and
at least one wire electrically connecting a part of the device-mounting pattern to another part of the device-mounting pattern,
wherein the device-mounting pattern comprises a plurality of wire connection regions, each of the wire connection regions being spaced apart from each other at a distance such that the connection regions are connected by the wire extending between the connection regions to alter one of a plurality of connection patterns by a wire connection between some of the plurality of the wire connection regions while an interconnection between the plurality of light-emitting elements are kept unchanged, each of the plurality of connection patterns has different numbers of series connection and parallel connection of the light-emitting elements,
wherein the at least one wire connects the wire connection regions jumping over at least a part of the device-mounting pattern,
wherein a plurality of rows of the light-emitting elements are capable of being disposed on the device-mounting pattern, each row of the rows of the light-emitting elements formed of a part of the light-emitting elements, and
wherein the device-mounting pattern is not interposed between any adjacent rows of the plurality of rows of the light-emitting elements except for a connection between adjacent light-emitting elements.

14. The light-emitting device according to claim 1, wherein the device-mounting pattern comprises an extending portion that is provided outside of the rows of the light-emitting elements and not provided between the rows of the light-emitting elements.

15. The light-emitting device according to claim 14, wherein the extending portion connects adjacent ones of the rows of the light-emitting elements in series.

16. The light-emitting device according to claim 1, wherein the device-mounting pattern is a plated device-mounting pattern.

17. The light-emitting device according to claim 1, wherein the connection regions are connected by two wires that are each wire bonded structures extending between the connection regions to establish the one of a plurality of connection patterns.

18. The light-emitting device according to claim 2, wherein the device-mounting pattern is a plated device-mounting pattern.

19. The light-emitting device according to claim 3, wherein the device-mounting pattern is a plated device-mounting pattern.

20. The mounting board according to claim 13, wherein the device-mounting pattern is a plated device-mounting pattern.

21. The mounting board according to claim 13, wherein the connection regions are connected by two wires that are each wire bonded structures extending between the connection regions to establish the one of a plurality of connection patterns.

22. The mounting board according to claim 13, wherein the wire is wire-bonded astride a portion of the device-mounting pattern such that the wire electrically connects two connection regions and such that the wire bonded structure extends over and is not connected to the portion of the device-mounting pattern.

23. The light-emitting device according to claim 1, wherein adjacent light-emitting elements are electrically connected via the device-mounting pattern, not via a wire.

24. The light-emitting device according to claim 1,
wherein the device-mounting pattern comprises
 element connection regions on which each of the plurality of light-emitting elements are flip-chip mounted,
 a wire connection region of the plurality of wire connection regions connected to some of the element connection regions, and
 an external connection portion connected to the wire connection region.

25. The light-emitting device according to claim 14, further comprising a first reflective member partially covering the upper surface of the mounting board to surround the light-emitting elements,
 wherein the extending portion has a thickness equal to or greater than a thickness of the first reflective member.

26. The light-emitting device according to claim 7, wherein the reflective member comprises a second reflective member covering the plurality of wire connection regions.

27. The light-emitting device according to claim 26, further comprising a protective element embedded in the second reflective member.

28. The light-emitting device according to claim 1,
 wherein the plurality of light-emitting elements are connected in series at least partially through the device-mounting pattern, and
 wherein the at least one wire jumps over a part of the device-mounting pattern forming the series connection.

* * * * *